(12) United States Patent
Mori

(10) Patent No.: US 6,329,669 B1
(45) Date of Patent: Dec. 11, 2001

(54) SEMICONDUCTOR DEVICE ABLE TO TEST CHANGEOVER CIRCUIT WHICH SWITCHES CONNECTION BETWEEN TERMINALS

(75) Inventor: Kaori Mori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/233,209

(22) Filed: Jan. 20, 1999

(30) Foreign Application Priority Data

Aug. 18, 1998 (JP) .................................................. 10-231740

(51) Int. Cl.$^7$ .................................................. H01L 23/58
(52) U.S. Cl. .................................................. 257/48
(58) Field of Search .................................. 327/564, 565; 257/48

(56) References Cited

U.S. PATENT DOCUMENTS 6,127,883 * 10/2000 Mori et al. ........................... 327/564

FOREIGN PATENT DOCUMENTS

| 57-072341-A | * | 5/1982 | (JP) | ............................... H01L/21/66 |
| 01-111364-A | * | 4/1989 | (JP) | ............................... H01L/27/04 |
| 04-290973-A | * | 10/1992 | (JP) | ............................... G01R/31/28 |
| 5-264647 | | 10/1993 | (JP) | . |
| 6-213972 | | 8/1994 | (JP) | . |
| 10-10204 | | 1/1998 | (JP) | . |

* cited by examiner

Primary Examiner—Wael Fabruyl
Assistant Examiner—William David Coleman
(74) Attorney, Agent, or Firm—McDermott, Will & Emery

(57) ABSTRACT

A semiconductor device and a method of manufacturing the semiconductor device which can reduce the number of test processes at the time of full-function test. The semiconductor device connects a pair of pins of a semiconductor chip with a pair of terminals provided in the semiconductor chip by way of a changeover circuit, and controls the changeover circuit according to a control, signal (M_ENA signal) input from the outside of the semiconductor chip, and switches connection between the pair of pins of the semiconductor chip and the pair of terminals provided in the semiconductor chip, and the device includes a switching action test circuit which tests the switching action of the changeover circuit.

7 Claims, 11 Drawing Sheets

SEMICONDUCTOR DEVICE ABLE TO TEST CHANGEOVER CIRCUIT WHICH SWITCHES CONNECTION BETWEEN TERMINALS

BACKGROUND OF THE INVENTION

1. Field of the Invention

The present invention relates to a semiconductor device capable of being used in accordance with forward and reverse bending specifications, and more particularly, to a semiconductor device capable of being switched, through use of an external signal, to an upwardly-bent semiconductor device or to a downwardly-bent semiconductor device through switching of a changeover circuit provided in a semiconductor chip, as well as to a method of manufacturing the semiconductor device.

2. Description of the Related Art

In omitting stub wiring from the surface of a board (or in taking measures against a linking problem or in reducing a packaging area), there may arise a necessity for manufacturing an upwardly-bent or downwardly-bent semiconductor device. To this end, there has already been proposed a semiconductor device which has a changeover circuit provided in a semiconductor chip and which can be switched to an upwardly-bent semiconductor device or a downwardly-bent semiconductor device through switching of the changeover circuit.

Even in a case of a CSP, BGA, or FBGA semiconductor chip which cannot be manufactured into an upwardly-bent chip by bending pins upwardly or into a downwardly-bent chip by downwardly bending pins downwardly, the semiconductor chip can be manufactured into an upwardly/downwardly-bent semiconductor chip through use of a structure such that a single semiconductor device can be used as either an upwardly-bent semiconductor device or a downwardly-bent semiconductor device by means of a changeover circuit. Although such a semiconductor chip does not have any bent portions, for the sake of convenience the semiconductor chip will be explained by reference to terms related to a bend mode.

FIGS. 10A and 10B show a conventional semiconductor device capable of being switched into an upwardly-bent or a downwardly-bent semiconductor device by means of the foregoing changeover circuit. Reference numeral 101 designates a semiconductor chip which can be switched to an upwardly-bent semiconductor chip or a downwardly-bent semiconductor chip. As shown in FIG. 10A, the semiconductor chip 101 can be switched to an upwardly-bent semiconductor chip through bringing an M_ENA signal to low ("L" value). Conversely, as shown in FIG. 10B, the semiconductor chip 101 can be switched to a downwardly-bent semiconductor chip through bringing the M_ENA signal to high ("H" value). As mentioned above, the semiconductor chip 101 shown in FIG. 10 can be used as either the upwardly-bent or downwardly-bent semiconductor chip through switching of the M_ENA signal.

FIGS. 11A and 11B are diagrammatic sketches, showing the interior of the conventional semiconductor device shown in FIGS. 10A and 10B. In the drawings, reference numeral 101 designates the semiconductor chip; 102 designates a changeover circuit which switches a connection between a pin A and an input terminal of an internal circuit 103 to a connection between a pin B and the input terminal, and vice versa; and 103 designates an internal circuit provided in the semiconductor chip. As shown in FIG. 11A, in an upwardly-bent mode (i.e., the M_ENA signal is low), a signal (intA) received by way of the pin A is output to an input terminal "a" of the internal circuit 103 by way of the changeover circuit 102. Further, a signal (intB) received by way of the pin B is output to an input terminal "b" of the internal circuit 103 by way of the changeover circuit 102.

In contrast, in a downwardly-bent mode (i.e., the M_ENA signal is high) such as that shown in FIG. 11B, the signal (intB) received by way of the pin A is output to the input terminal "b" of the internal circuit 103 by way of the changeover circuit 102. Further, the signal (intA) received by way of the pin B is output to the input terminal "a" of the internal circuit 103 by way of the changeover circuit 102.

FIGS. 12A and 12B show the changeover circuit 102 shown in FIGS. 11A and 11B. FIG. 12A depicts the upwardly-bent mode, and FIG. 12B depicts the downwardly-bent mode. In the drawings, reference numeral 121 designates a register which holds the signal input from the pin A in synchronization with the high edge of a clock signal (hereinafter referred to as a "CLK signal") and outputs the signal; and 122 designates a register which holds the signal input from the pin B in synchronization with the high edge of the CLK signal and outputs the signal.

Reference numeral 123 designates a selector which outputs the signal received by way of the register 121 to the input terminal "a" when the M_ENA signal is low and outputs the signal received by way of the register 122 to the input terminal "a" when the M_ENA signal is high.

Reference numeral 124 designates a selector which outputs the signal received by way of the register 122 to the input terminal "a" when the M_ENA signal is low and outputs the signal received by way of the register 121 to the input terminal "a" when the M_ENA signal is high.

The operation of the changeover circuit 102 will now be described.

As shown in FIG. 12A, when the M_ENA signal is low, the signal (intA) received by way of the pin A is output to the selectors 123 and 124 by way of the register 121, and the signal (intB) received by way of the pin B is output to the selectors 123 and 124 by way of the register 122. Since the M_ENA signal is low, the selector 123 outputs the signal (intA) received by way of the register 121 (pin A) to the input terminal "a," and the selector 124 outputs the signal (intB) received by way of the register 122 (pin B) to the input terminal "b."

In contrast, as shown in FIG. 12B, when the M_ENA signal is high, the signal (intB) received by way of the pin A is output to the selectors 123 and 124 by way of the register 121, and the signal (intA) received by way of the pin B is output to the selectors 123 and 124 by way of the register 122. Since the M_ENA signal is high, the selector 123 outputs the signal (intA) received by way of the register 122 (pin B) to the input terminal "a," and the selector 124 outputs the signal (intA) received by way of the register 121 (pin A) to the input terminal "b."

As mentioned above, in an upwardly-bent mode such as that shown in FIG. 12A, the signal received by way of the pin A is output to the input terminal "a," and the signal received by way of the pin B is output to the input terminal "b." In a downwardly-bent mode such as that shown in FIG. 12B, the signal received by way of the pin A is output to the input terminal "b," and the signal received by way of the pin B is output to the input terminal "a."

A method of testing the semiconductor device shown in FIGS. 10A and 10B will now be described.

FIG. 13 is a flowchart for testing the semiconductor device shown in FIGS. 10A and 10B. As shown in FIG. 13, upon completion of assembly of a semiconductor chip such as that shown in FIG. 10, the M_ENA signal is brought to low, and the semiconductor chip is subjected to a full-function test for the upwardly-bent mode.

During the full-function test, the semiconductor device is subjected to, e.g., a conductivity check for checking the conduction of wiring patterns, a DC test for checking a correct electric current flowing through a predetermined location, a function test for testing the functions of the semiconductor device, and speed item selection in which a semiconductor chip is selected according to its performance.

Next, the M_ENA signal is brought to high, and the semiconductor device is subjected to a full-function test for the downwardly-bent mode. As in the case of the full-function test for the upwardly-bent mode, during the full-function test for the downwardly-bent mode the semiconductor chip is subjected to the conductivity check, the DC test, the function test, and the speed item selection.

In the foregoing conventional semiconductor device, the internal circuit performs the same operations regardless of whether the semiconductor device is in the upwardly-bent mode or in the downwardly-bent mode. In spite of this, in order to check whether or not the internal circuit operates properly in the upwardly-bent mode as well as in the downwardly-bent mode, the semiconductor device must be subjected to both the full-function test for the upwardly-bent mode and the full-function test for the downwardly-bent mode.

SUMMARY OF THE INVENTION

The present invention has been conceived to solve the drawback of the conventional semiconductor device, and the object of the present invention is to provide a semiconductor device which enables checking of whether or not a semiconductor chip operates properly in both an upwardly-bent mode and a downwardly-bent mode by subjecting the semiconductor chip to solely a full-function test for an upwardly (or downwardly)-bent mode, and by checking solely the operations of a changeover circuit provided in the semiconductor chip, without the semiconductor device being subjected to a full-function test for a downwardly-bent mode (or upwardly-bent mode). Another object of the present invention is to provide a method of manufacturing the semiconductor device.

According to a first aspect of the present invention, there is provided a semiconductor device which connects a pair of pins of a semiconductor chip with a pair of terminals provided in the semiconductor chip by way of a changeover circuit and which switches connection between the pair of pins of the semiconductor chip and the pair of terminals provided in the semiconductor chip, by controlling the changeover circuit according to a control signal input from the outside of the semiconductor chip, the device comprising a switching action test circuit which tests the switching action of the changeover circuit.

According to a second aspect of the present invention, there is provided a method of manufacturing a semiconductor device which connects a pair of pins of a semiconductor chip with a pair of terminals provided in the semiconductor chip by way of a changeover circuit and which switches connection between the pair of pins of the semiconductor chip and the pair of terminals provided in the semiconductor chip, by controlling the changeover circuit according to a control signal input from the outside of the semiconductor chip, the method comprising the steps of forming a switching action test circuit for testing the switching action of the changeover circuit; performing a final test under first connect condition in which the pair of pins of the semiconductor chip are connected with the pair of terminals provided in the semiconductor chip by controlling a control signal after the step of forming a switching action test circuit; and checking the switching action of the changeover circuit through use of the switching action test circuit under second connect condition in which the connection made during the step of performing a final test between the pair of pins of the semiconductor chip and the pair of terminals provided in the semiconductor chip is reversed by controlling the control signal after the step of performing a final test.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1A:
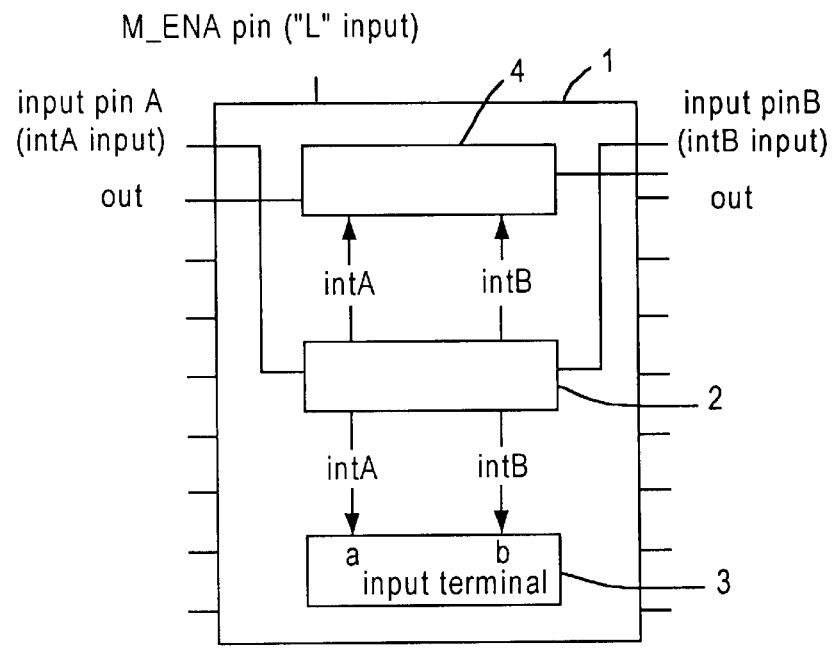
FIGS. 1A and 1B are schematic diagrams showing the semiconductor device according to the embodiment 1 of the present invention.

Embodiments of the present invention will be described below with reference to the accompanying drawings. It is noted that the same reference symbols in the drawings denote the same or corresponding components.

Embodiment 1

A semiconductor device according to a embodiment 1 is provided with a switching action test circuit for checking a switching action of a changeover circuit. By means of the switching action test circuit, a check can be made as to whether or not the changeover circuit of the semiconductor device-which enables a semiconductor chip to be used in either an upwardly-bent mode or a downwardly-bent mode-operates properly.

Figure 1B:
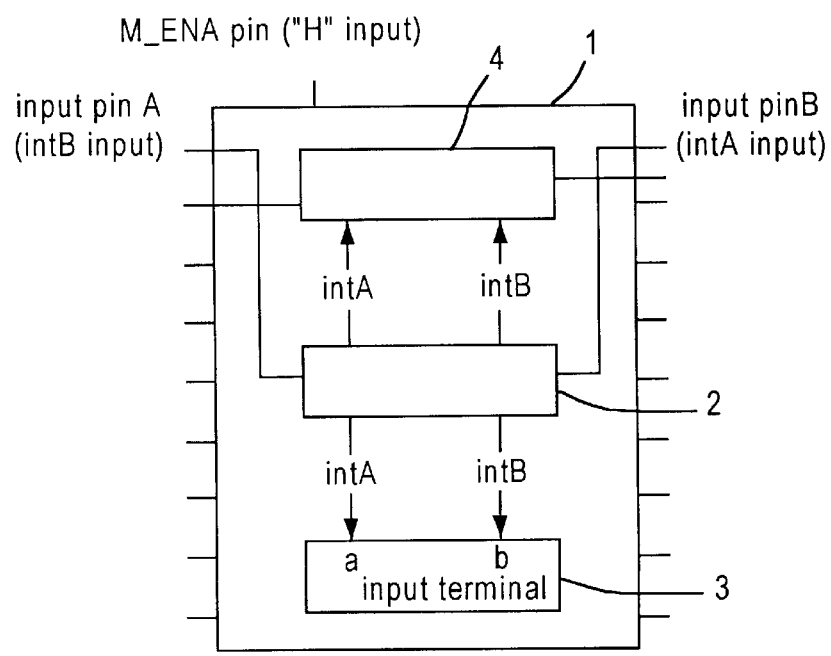

FIGS. 1A and 1B are schematic diagrams showing the semiconductor device according to the embodiment 1 of the present invention. FIG. 1A shows the semiconductor device in an upwardly-bent mode, and FIG. 1B shows the semiconductor device in a downwardly-bent mode. In the drawings, reference numeral 1 designates a semiconductor chip having input/output pins which receive signals from and output signals to the outside; 2 designates a changeover circuit which is provided in the semiconductor chip 1 and is connected to, e.g., input pins A and B and input terminals "a" and "b" of an internal circuit 3, and which performs switching so as to effect a connection between the input pin A and the input terminal "a" and a connection between the input pin B and the input terminal "b," or a connection between the input pin A and the input terminal "b" and a connection between the input pin B and the input terminal "a," by means of a control signal (hereinafter referred to as a "M_ENA signal") entered from the outside the semiconductor chip Reference numeral 3 designates an internal circuit provided in the semiconductor chip; and 4 designates a switching action test circuit for checking a switching action of the changeover circuit 2. The switching action test circuit 4 tests whether or not the changeover circuit 2 operates properly, through comparison of the signals (intA and intB) output from the changeover circuit 2 with the signals received by way of the input pins.

Figure 2A:
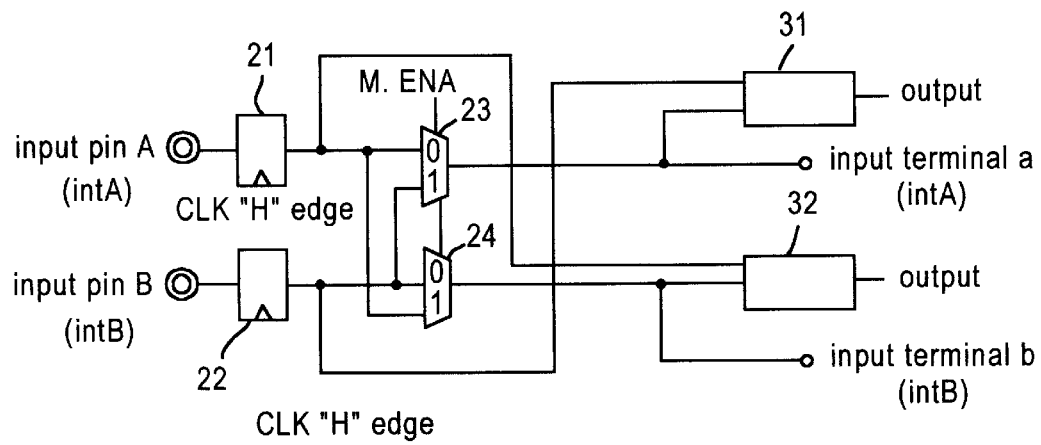
FIGS. 2A and 2B are schematic diagrams showing the changeover circuit 2 and the switching action test circuit 4 of the semiconductor device shown in FIG. 1.
Figure 2B:
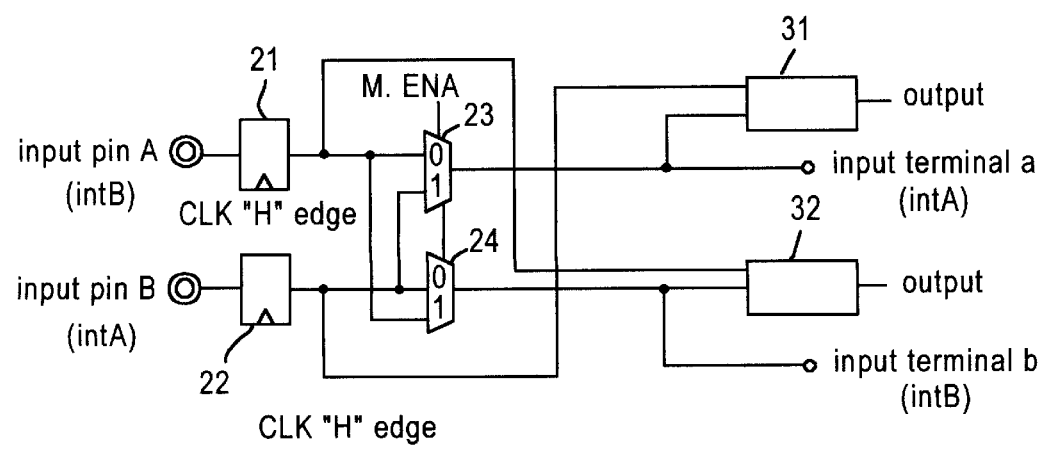

FIGS. 2A and 2B are schematic diagrams showing the changeover circuit 2 and the switching action test circuit 4 of the semiconductor device shown in FIG. 1. FIG. 2A shows the changeover circuit 2 when it is switched so that the semiconductor device is brought to an upwardly-bent mode, and FIG. 2B shows the changeover circuit 2 when it is switched so that the semiconductor device is brought to a downwardly-bent mode. In the drawings, reference numeral 21 designates an input register which acquires the signal from the input pin A in synchronization with the high ("H") edge of a CLK signal; and 22 designates an input register which acquires a signal from the input pin B in synchronization with the high edge of the CLK signal.

Reference numeral 23 designates a selector which, in response to the M_ENA signal, selects one of the signal received by way of the input register 21 and the signal received by way of the input register 22 and which outputs the thus-selected signal to the input terminal "a" of the internal circuit 3. Reference numeral 24 designates a selector which, in response to the M_ENA signal, selects one of the signal received by way of the input register 21 and the signal received by way of the input register 22 and which outputs the thus-selected signal to the input terminal "a" of the internal circuit 3.

When the M_ENA signal is low ("L" value), the selector 23 outputs to the input terminal "a" the signal received by way of the input register 21 (pin A), and the selector 24 outputs to the input terminal "b" the signal received by way of the input register 22 (pin B). Conversely, when the M_ENA signal is high ("H" value), the selector 23 outputs to the input terminal "a" the signal received by way of the input register 22 (pin B), and the selector 24 outputs to the input terminal "b" the signal received by way of the input register 21 (pin A).

Reference numeral 31 designates a comparator which compares the signal output from the input register 22 with the signal output from the selector 23; and 32 designates a comparator which compares the signal output from the input register 21 with the signal output from the selector 24.

These comparators constitute the switching action test circuit 4 which tests the switching action of the changeover circuit 2. The comparator 31 compares the signal received by way of the pin B with the signal received by way of the input terminal "a" and outputs the result of such comparison to the outside of the semiconductor chip 1. The comparator 32 compares the signal received by way of the pin A with the signal received by way of the input terminal "b" and outputs the result of such comparison to the outside of the semiconductor chip 1. The comparators 31 and 32 may be formed from any type of device, e.g., a computing unit which performs an EXOR operation or a comparator, so long as they can compare input signals with each other.

The switching action test circuit 4 is formed by formation of the changeover circuits 23 and 24; by formation of the comparators 31 and 32 in the semiconductor chip 1; by formation of wiring patterns so as to permit entry of signals into the comparators 31 and 32 from the input registers 21 and 22; and by connection of the wiring patterns with pins so that the signals output from the comparators can be output to the outside of the semiconductor chip 1. Alternatively, the changeover circuits 23 and 24 may be formed after (or simultaneous with) formation of the comparators 31 and 32 which constitute the switching action test circuit 4.

The operations of the changeover circuits 23 and 24 shown in FIGS. 2A and 2B will now be described.

In a case where the semiconductor device shown in FIG. 1 is used as an upwardly-bent semiconductor device, the M_ENA signal is brought to low. As shown in FIG. 2A, the signal (intA) received by way of the pin A is delivered to the selector 23 by way of the input register 21, and the signal (intB) received by way of the pin B is delivered to the selector 24 by way of the input register 22. At this time, since the M_ENA signal is low, the selector 23 outputs to the input terminal "a" the signal (intA) received by way of the input register 21 (pin A), and the selector 24 outputs to the input terminal "b" the signal (intB) received by way of the input register 22 (pin B). Thus, the semiconductor chip 1 operates as an upwardly-bent semiconductor chip.

In contrast, in a case where the semiconductor device shown in FIG. 1 is used as a downwardly-bent semiconductor device, the M_ENA signal is brought to high. As shown in FIG. 2B, the signal (intB) received by way of the pin A is delivered to the selector 23 by way of the input register 21, and the signal (intA) received by way of the pin B is delivered to the selector 24 by way of the input register 22. At this time, since the M_ENA signal is high, the selector 23 outputs to the input terminal "a" the signal (intA) received by way of the input register 22 (pin B), and the selector 24 outputs to the input terminal "b" the signal (intB) received by way of the input register 21 (pin A). Thus, the semiconductor chip 1 operates as a downwardly-bent semiconductor chip.

A method of testing the semiconductor device shown in FIG. 1 will now be described.

Figure 3:
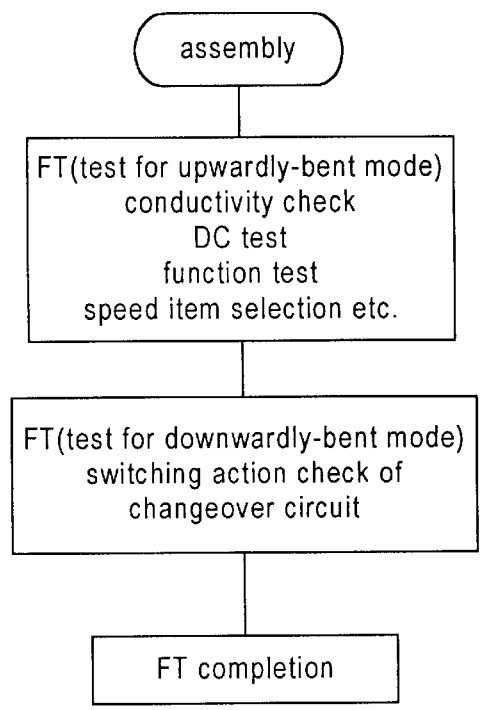
FIG. 3 is a flowchart showing tests for the semiconductor device shown in FIG. 1.

FIG. 3 is a flowchart showing tests for the semiconductor device shown in FIG. 1. As shown in FIG. 3, after completion of assembly of the semiconductor chip shown in FIG. 1, the M_ENA signal is brought to low, and the semiconductor chip 1 is subjected to a full-function test for an upwardly-bent mode. During the full-function test, the semiconductor chip 1 is subjected to, e.g., a conductivity check for checking conductivity among wiring patterns, a DC test for checking whether or not a correct electric current flows through predetermined locations, a function test for testing functions, and speed item selection for selecting a semiconductor device according to performance.

Next, the M_ENA signal is brought to high, and the semiconductor chip is subjected to a full-function test for a downwardly-bent mode. During the full-function test, the switching action test circuit 4 checks solely the operations of the selectors 23 and 24 which constitute the changeover circuit 2. In the semiconductor device shown in FIG. 1, the changeover circuit 2 is completely isolated from the remainder of the internal circuit 3. The remainder of the internal circuit 3 (i.e., that potion of the internal circuit 4 which does not include the changeover circuit 2) performs the same operations without regard to whether the semiconductor chip 1 is in the upwardly-bent mode or the downwardly-bent mode. Accordingly, upon being subjected to the full-function test for the upwardly-bent mode, the semiconductor device has already been subjected to the tests other than a test regarding the switching action of the changeover circuit 2. For this reason, so long as the switching action of the semiconductor chip 1 is tested, the semiconductor chip 1 is deemed to have finished undergoing the full-function test for the downwardly-bent mode without having to be subjected to the remaining tests in a redundant manner.

A method by which the switching action test circuit 4 tests the switching action of the changeover circuit 2 will now be described.

The M_ENA signal is brought to high, and the semiconductor device is brought to the downwardly-bent mode. As has been described in reference to the operations of the changeover circuit when the semiconductor device is in the downwardly-bent mode, so long as the selector 23 operates properly, the signal received by way of the pin B is output from the input terminal "a." Further, so long as the selector 24 operates properly, the signal received by way of the pin A is output from the input terminal "b."

The comparator 31 compares the signal output from the selector 23 (i.e., the signal output from the input terminal "a") with the signal received from the pin B by way of the input register 22 and outputs the result of such comparison. Therefore, so long as the selector 23 operates properly, a correct comparison result is output; otherwise a different result would be output. From this comparison result, the operation of the selector 23 which constitutes the changeover circuit 2 can be checked.

Similarly, the comparator 32 compares the signal output from the selector 24 (i.e., the signal output from the input terminal "b") with the signal received from the pin A by way of the input register 21 and outputs the result of such comparison. Therefore, so long as the selector 24 operates properly, a correct comparison result is output; otherwise a different result would be output. From this comparison result, the operation of the selector 24 which constitutes the changeover circuit 2 can be checked.

At the time of checking of the changeover circuit 2, the signal input to the input terminal "a" should preferably be set so as to assume a value different from that of the signal input to the input terminal "b" (e.g., one of the input signals assumes a high level value, and the remaining input signal assumes a low level value). As a result, even if a signal contrary to the signal which should be output at the time of a normal operation were output for reasons of faulty operations of the changeover circuit 2, faulty operations of the changeover circuit 2 can be detected.

The signals output from the comparators 31 and 32 can also be output from existing terminals of the semiconductor chip 1. Consequently, the signals output from the individual comparators may be detected from the outside of the semiconductor chip by utilization of the terminals.

Since the action of the input registers 21 and 22 acquiring input signals from the pins is triggered by a high edge of the CLK signal, the operations required in the period during which the signals are input to the comparators 31 and 32 from the input registers 21 and 22 must be completed within one cycle of the CLK signal.

In the embodiment 1, the signals are output from the individual comparators 31 and 32. Provided that high level signals are output from the individual comparators so long as there is a match between input signals and that the outputs from the comparators are degenerated (or an AND result is produced), a high level signal is output when all the selectors operate normally. In contrast, if any of the selectors operates abnormally, a low level signal is output. In this way, there can be made a determination as to whether or not the selectors operate normally, through use of only one bit of an output signal.

Conversely, provided that low level signals are output from the individual comparators so long as there is a match between input signals and that the signals output from the comparators are degenerated (i.e., an OR result is produced), there can be made a determination as to whether or not the selectors operate normally, through use of only one bit of an output signal.

In the embodiment 1, there can be performed only the switching action of the changeover circuit for the downwardly-bent mode; however, the present invention is not limited to this embodiment. It goes without saying that the switching action of the changeover circuit for the upwardly-bent mode can be checked by reversing the input registers from which the comparators 31 and 32 receive signals.

In the embodiment 1, there is provided the switching action test circuit for testing the switching action of the changeover circuit provided in the semiconductor chip, and hence the semiconductor chip can be tested without involving the full-function test for the downwardly-bent mode.

In the embodiment 1, the semiconductor device can be tested as to whether or not it operates properly in either the upwardly-bent or downwardly-bent mode, by being subjected to solely one full-function test and by testing of the switching action of the changeover circuit. As a result, the number of test processes can be reduced.

Embodiment 2

In the embodiment 1, a switching action of the changeover circuit detected in only the upwardly-bent mode or in only the downwardly-bent mode. In contrast, according to a embodiment 2, since the changeover circuit is newly provided with a selector, a switching action of the changeover circuit can be detected in either one of the upwardly-bent mode and the downwardly-bent mode.

Figure 4:
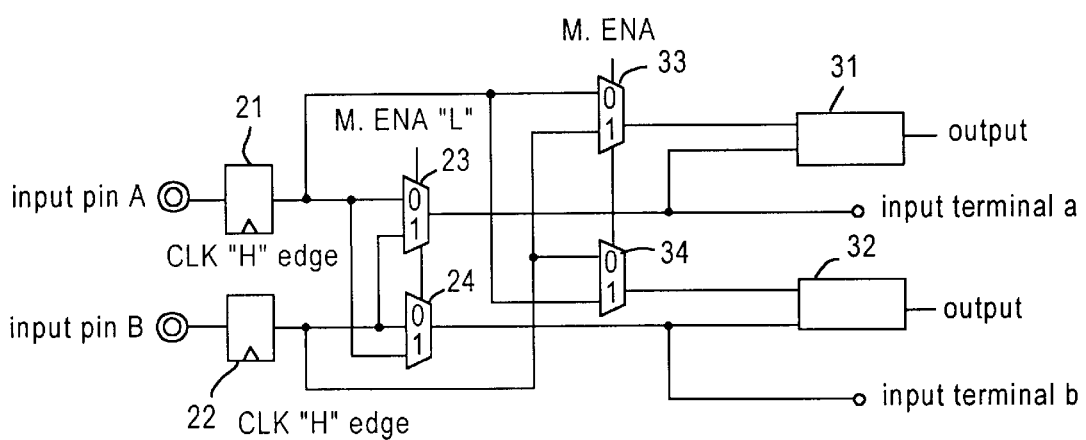
FIG. 4 shows the changeover circuit 2 and the switching action test circuit 4 provided in the semiconductor device shown in FIG. 1.

FIG. 4 shows the changeover circuit 2 and the switching action test circuit 4 provided in the semiconductor device shown in FIG. 1. In the drawing, reference numeral 33 designates a selector which selects, according to the M_ENA signal, either the signal received from the input register 21 or the signal received from the input register 22 and which outputs the thus-selected signal to the comparator 31; and 34 designates a selector which selects, according to the M_ENA signal, either the signal received from the input register 21 or the signal received from the input register 22 and which outputs the thus-selected signal to the comparator 32.

When the M_ENA signal is low ("L" value), the selector 33 outputs to the comparator 31 the signal received from the input register 21 (pin A), and the selector 34 outputs to the comparator 32 the signal received from the input register 22 (pin B). Conversely, when the M_ENA signal is high ("H" value), the selector 33 outputs to the comparator 31 the signal received from the input register 22 (pin B), and the selector 34 outputs to the comparator 32 the signal received from the input register 21 (pin A).

Reference numeral 31 designates a comparator which compares the signal received from the selector 23 with the signal received from the selector 33; and 32 designates a comparator which compares the signal received from the selector 24 with the signal received from the selector 34. In other respects, the semiconductor device according to the embodiment 2 is identical with that shown in FIGS. 2A and 2B, and repeated explanations of the identical portions will be omitted here.

The operation of the semiconductor device according to the embodiment 2 will now be described. With regard to operations and a method of testing the operations, the semiconductor device according to the embodiment 2 is identical with the semiconductor device according to the embodiment 1, except for the method of checking the switching action of the changeover circuit. An explanation will be given of the method of checking the switching action of the changeover circuit.

To begin with, an explanation will be given of the method of checking the switching action of the changeover circuit when the semiconductor device is in an upwardly-bent mode.

The M_ENA signal is set to low, thereby bringing the semiconductor device to an upwardly-bent mode. So long as the selector 23 operates properly, the signal received by way of the pin A is delivered to the input terminal "a." In contrast, so long as the selector 24 operates properly, the signal received by way of the pin B is delivered to the input terminal "b."

In the upwardly-bent mode, the signal received from the selector 33 is output, and the comparator 31 compares the signal received from the selector 23 (i.e., the signal received from the input terminal "a") with the signal received from the selector 33. As a result, the switching action of the selector 23 can be checked.

Similarly, the comparator 32 compares the signal received by way of the selector 24 (the signal received from the input terminal "b") with the signal received by way of the selector 34 (i.e., pin B). As a result, the switching action of the selector 24 can be checked.

There will now be described the switching action of the changeover circuit when the semiconductor device is in the downwardly-bent mode.

The M_ENA signal is brought to high, thereby bringing the semiconductor device to the downwardly-bent mode. So long as the selector 23 operates properly, the signal received by way of the pin B is delivered to the input terminal "a." Similarly, so long as the selector 24 operates properly, the signal received by way of the pin A is delivered to the input terminal "b."

In the downwardly-bent mode, the selector 33 outputs the signal received from the pin B, and the comparator 31 compares the signal received from the selector 23 (i.e., the signal received by way of the input terminal "a") with the signal received from the selector 33, thereby enabling checking of switching action of the selector 23.

Similarly, the comparator 32 compares the signal received from the selector 24 (i.e., the signal received by way of the input terminal "b") with the signal received from the selector 34, thereby enabling checking of switching action of the selector 24.

In the embodiment 2, since the signal output from the selector—which selects one of the signals received by way of the pins—is compared with one of the signals input to the terminals, the switching action of the changeover circuit can be checked when the semiconductor device is in either one of the upwardly-bent mode and the downwardly-bent mode.

Embodiment 3

In the first and embodiment 2s, electrical connection between input pins of a semiconductor chip and input terminals of an internal circuit of the semiconductor chip is switched by means of a changeover circuit. In contrast, according to a embodiment 3, electrical connection between output pins of a semiconductor chip and output terminals of an internal circuit of the semiconductor chip is switched by means of a changeover circuit.

Figure 5A:
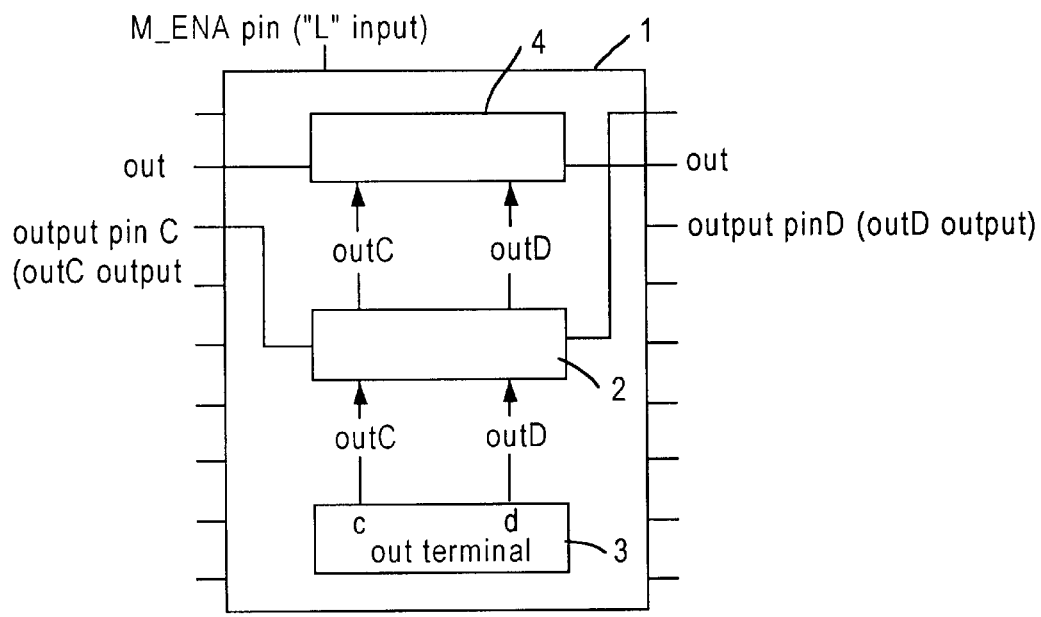
FIGS. 5A and 5B are schematic diagrams showing a semiconductor device according to the embodiment 3.
Figure 5B:
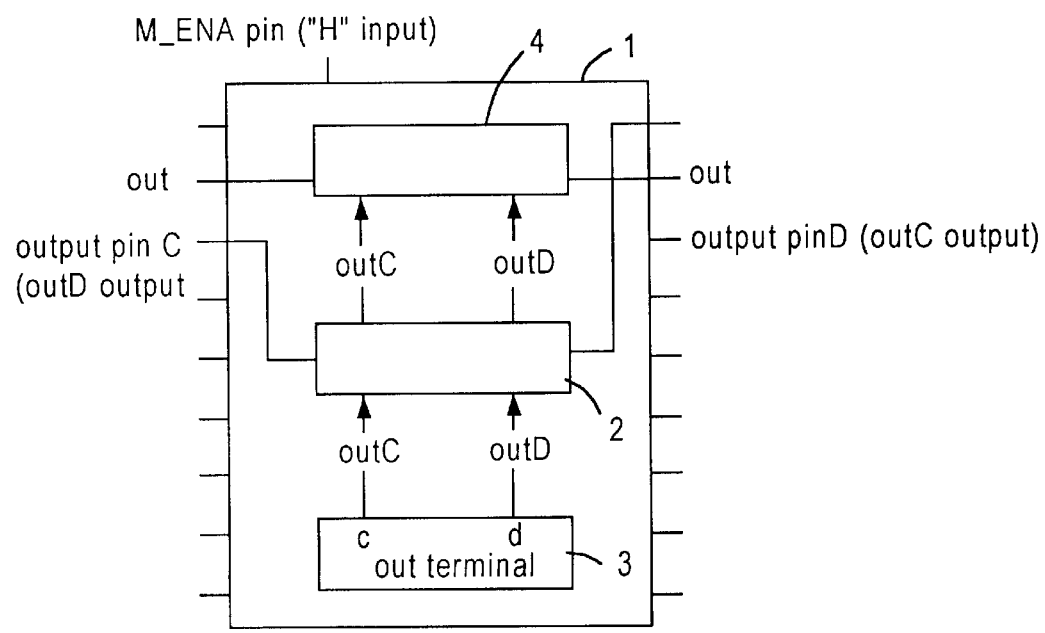

FIGS. 5A and 5B are schematic diagrams showing a semiconductor device according to the embodiment 3. In the drawing, reference numeral 1 designates a semiconductor chip having input/output pins, each of which receives a signal from or outputs a signal to the outside of the semiconductor device; 2 designates a changeover circuit which is provided in the semiconductor chip 1 and which is connected to, e.g., output terminals "c" and "d" of an internal circuit 3 provided in the semiconductor chip 1 and output pins C and D. According to the M_ENA signal input to the changeover circuit 2 from the outside of the semiconductor chip 1, the changeover circuit 2 performs switching action so as to establish connection between the output terminal "c" and the output pin C, connection between the output terminal "d" and the output pin D, connection between the output terminal "d" and the output pin C, or connection between the output terminal "c" and the output pin D.

Reference numeral 3 designates an internal circuit provided in the semiconductor chip 1; and 4 designates a switching action test circuit which tests the switching action of the changeover circuit 2. The switching action test circuit 4 tests whether or not the changeover circuit 2 operates properly, by comparing the signal outputs by way of the changeover circuit 2 with the respective signals received from the output terminals.

Figure 6:
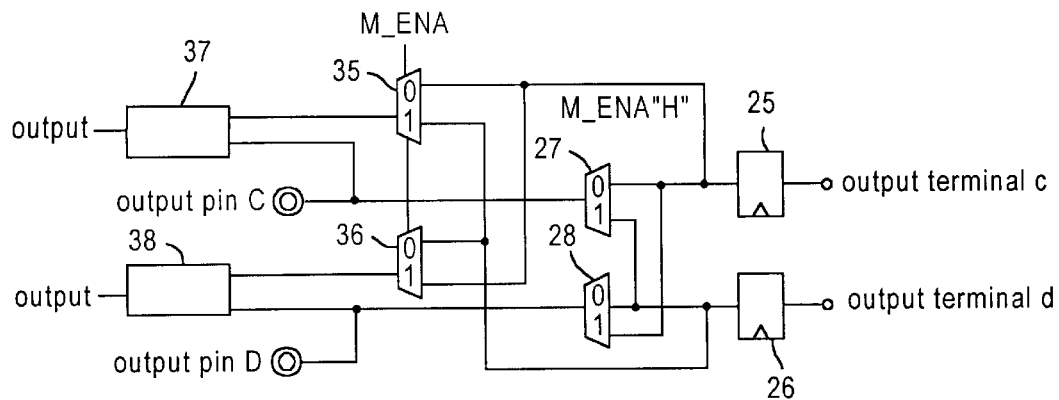
FIG. 6 is a schematic diagram showing the changeover circuit 2 and the switching action test circuit 4 provided in the semiconductor device shown in FIGS. 5A and 5B.

FIG. 6 is a schematic diagram showing the changeover circuit 2 and the switching action test circuit 4 provided in the semiconductor device shown in FIGS. 5A and 5B. In the drawing, reference numeral 25 designates an output register which acquires, in synchronization with the high ("H") edge of the CLK signal, the signal received by way of the output terminal "c"; and 26 designates an output register which acquires, in synchronization with the high edge of the CLK signal, the signal received by way of the output terminal "d."

Reference numeral 27 designates a selector which, in response to the M_ENA signal, selects either the signal output from the output register 25 or the signal output from the output register 26 and which outputs the thus-selected signal to the output pin C of the semiconductor chip 1. Reference numeral 28 designates a selector which, in response to the M_ENA signal, selects either the signal output from the output register 25 or the signal output from the output register 26 and which outputs the thus-selected signal to the output pin D of the semiconductor chip 1.

When the M_ENA signal is low ("L" value), the selector 27 outputs to the output pin C the signal received from the output terminal "c," and the selector 28 outputs to the output pin D the signal received from the output register terminal "d." Conversely, when the M_ENA signal is high, the selector 27 outputs to the output pin C the signal received from the output terminal "d," and the selector 28 outputs to the output pin D the signal received from the output terminal "c."

Reference numeral 35 designates an output register 25 which, according to the M_ENA signal, selects either the signal output from the output register 25 or the signal output from the output register 26 and which outputs the thus-selected signal to the comparator 37; and reference numeral 36 designates a selector which, according to the M_ENA signal, selects either the signal output from the output register 25 or the signal output from the output register 26 and which outputs the thus-selected signal to the comparator 38.

When the M_ENA signal is low, the selector 35 selects the signal output from the output register 25 (i.e., the signal received by way of the output terminal "c") and outputs the thus-selected signal to the comparator 37, and the selector 36 selects the signal output from the output register 26 (i.e., the signal received by way of the output terminal "d") and outputs the thus-selected signal to the comparator 38. Conversely, when the M_ENA signal is high, the selector 35 selects the signal output from the output register 26 (i.e., the signal received by way of output terminal "d") and outputs the thus-selected signal to the comparator 37. The selector 36 selects the signal output from the output register 25 (i.e., the signal received by way of the output terminal "c") and outputs the thus-selected signal to the comparator 38.

Reference numeral 37 designates a comparator which compares the signal output from the selector 27 with the signal output from the selector 35; and 38 designates a comparator which compares the signal output from the selector 28 with the signal output from the selector 36. The comparators 37 and 38 constitute a switching action test circuit which tests the switching action of the changeover circuit. From the comparison results output from the individual comparators, the switching action of the changeover circuit can be checked.

With regard to the operations of the changeover circuit and the switching action test circuit and the method of testing these circuits, the semiconductor device shown in FIG. 6 operates in basically the same manner as the semiconductor device according to the embodiment 2, except for the pins A and B being replaced with the output terminals "c" and "d" and the input terminals "a" and "b" being replaced with the pins C and D. Accordingly, for the sake of brevity an explanation of operations of the changeover circuit and the switching action test circuit will be omitted here.

In the embodiment 3, the semiconductor device is provided with a switching action test circuit which tests the switching action of a changeover circuit (i.e., a changeover circuit for switching connection between an output terminal of the internal circuit provided in a semiconductor chip and an output pin of the semiconductor chip) provided in a semiconductor chip. As a result, the switching action of the changeover circuit can be tested, and the semiconductor chip can be tested without performance of a full-function test for the upwardly-bent or downwardly-bent mode.

Embodiment 4

In the embodiment 3, the switching action of the changeover circuit which switches an output signal is tested through use of the signal output from the interior of the semiconductor chip (i.e., the internal circuit). In contrast, according to the embodiment 4, the switching action of the changeover circuit which switches an output signal is tested through use of a signal received by way of an input pin.

Figure 7:
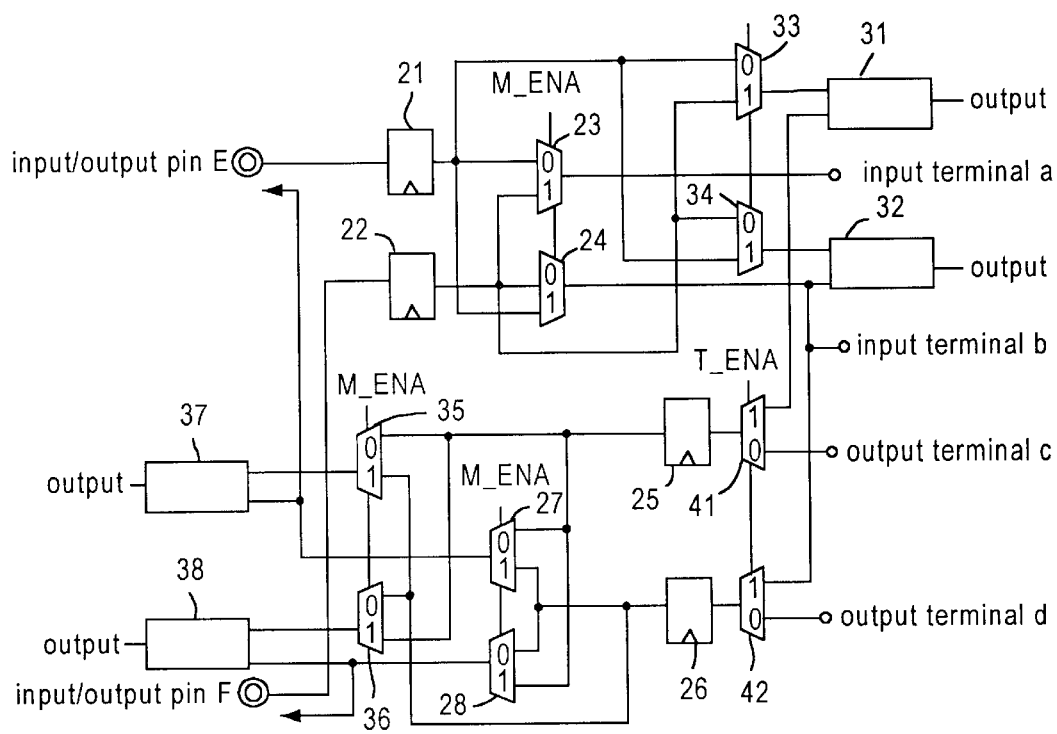
FIG. 7 is a circuit diagram showing a semiconductor device according to the embodiment 4.

FIG. 7 is a circuit diagram showing a semiconductor device according to the embodiment 4. In the drawing, reference numeral 41 designates an input signal switching circuit which, according to a control signal (hereinafter referred to as a "T_ENA signal"), selects either the signal output from the selector 23 or the signal output from the output terminal "c" of the internal circuit provided in the semiconductor chip and which outputs the thus-selected signal to the output register 25.

Reference numeral 42 designates a selector which selects, according to the T_ENA signal, either the signal output from the selector 24 or the signal output from the output terminal of the internal circuit provided in the semiconductor chip and which outputs the thus-selected signal to the output register 26.

When the T_ENA signal is high ("H" value), the selector 41 outputs the signal output from the selector 23 (or the received by way of a pin E or F), and the selector 42 outputs to the output register 26 the signal output from the selector 24 (or the signal received by way of the pin F or E). Conversely, when the T_ENA signal is low ("L" value), the selector 41 outputs to the output register 25 the signal output from the output terminal "c," and the selector 42 outputs to the output register 26 the signal output from the output terminal "d."

As described above, there is formed a bypass circuit which enables entry, to an output switching circuit, of a signal received from an input pin without flow of the signal through the internal circuit.

The changeover circuit and the switching action test device shown in FIG. 7 are designed so as to connect the changeover circuit and the switching action test circuit according to the embodiment 2 shown in FIGS. 2A and 2B with the changeover circuit and the switching action test device according to the embodiment 3 shown in FIG. 6, by way of the selectors 41 and 42. Consequently, for the sake of brevity, explanations of the other portions of the circuit and device will be omitted here. Further, the changeover circuit and the switching action test device operate in the same way as do those described in the second and embodiment 3s, except for the selectors 41 and 42. Accordingly, explanations of operations of the changeover circuit and the switching action test device will be omitted.

The operations of the selectors 41 and 42 will be described hereinbelow.

When the T_ENA signal is high, the selector 41 outputs to the output register 25 the signal output from the selector 23, and the selector 42 outputs to the output register 26 the signal output from the selector 42. As a result, when the T_ENA signal is low, the signal received from the pin E is delivered to the output register 25 by way of the selectors 23 and 41. Further, the signal received from the pin F is delivered to the output register 26 by way of the selectors 24 and 42.

Conversely, when the M_ENA signal is high, the signal received from the pin F is delivered to the output register 25, and the signal received from the pin E is delivered to the output register 26.

When the T_ENA signal is low, the selector 41 outputs to the output register 25 the signal output from the output terminal "c," and the selector 42 outputs the signal output to the output register 26 from the output terminal "d."

As mentioned above, as a result of the T_ENA signal being brought to high, the signals received from the pins E and F can be delivered to the output registers 25 and 26 without flow of the signals through the internal circuit. Conversely, when the T_ENA signal is brought to low, the signals output from the output terminals "c" and "d" are output to the output registers 25 and 26, as in the case of ordinary operations.

In the embodiment 4, the signal received from the input pin by way of the selector, or the input signal changeover circuit, can be output to the output register without flow of the signal through the internal circuit. Therefore, the switching action of the output switching circuit can be checked without being affected by operations of the internal circuit.

Embodiment 5

Figure 8:
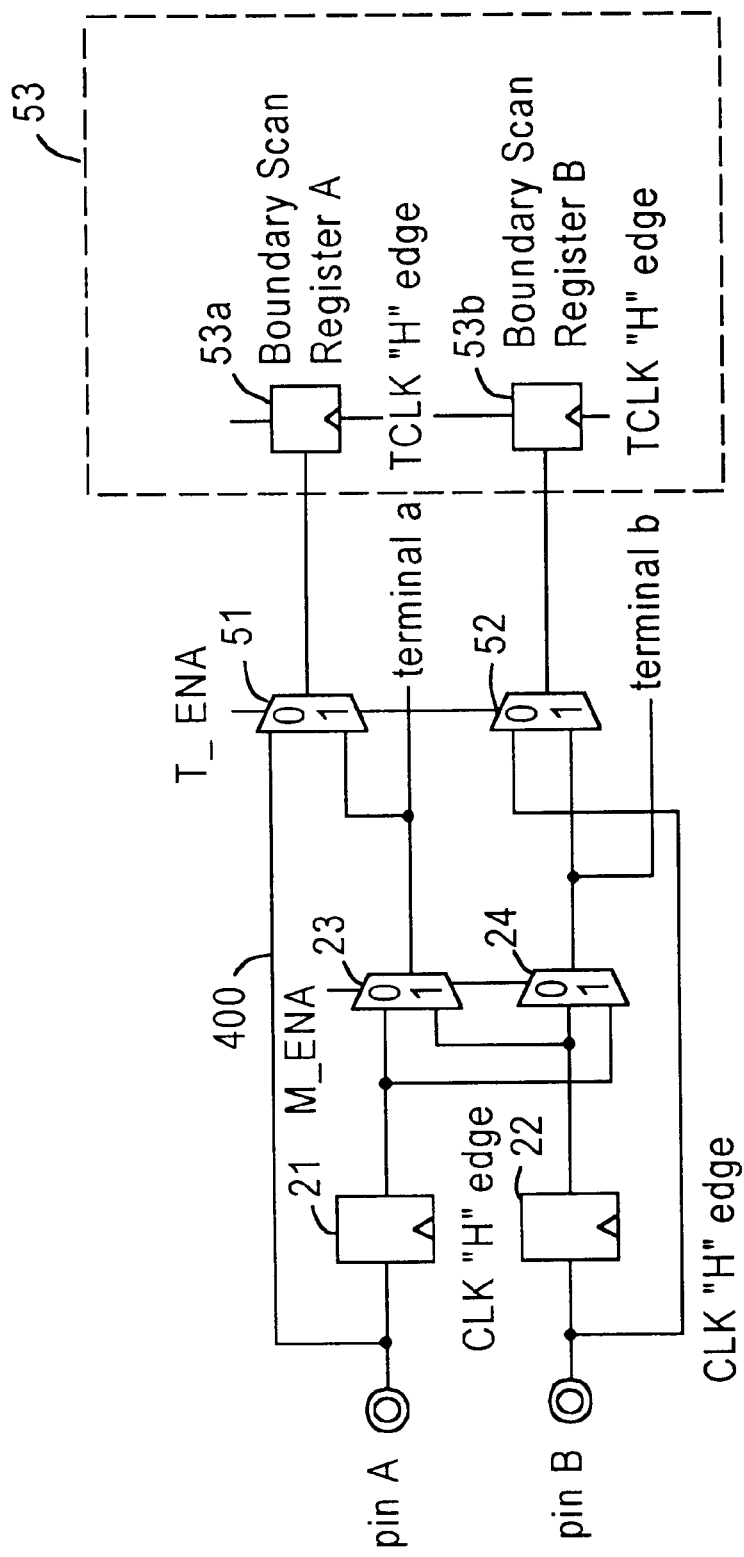
FIG. 8 is a semiconductor device according to a embodiment 5 of the present invention.

FIG. 8 shows a semiconductor device according to a embodiment 5 of the present invention. In the drawing, reference numeral 51 designates a selector or an input signal switching circuit which, according to the control signal (i.e., T_ENA signal), selects either the signal received from the input pin A or the signal output from the selector 23 and which outputs the thus-selected signal to a boundary scan register 53a of a boundary scanning circuit 53 provided in a semiconductor chip; and 52 designates a selector or an input signal switching circuit which, according to the T_ENA signal, selects either the signal received from the input pin B or the signal output from the selector 24 and which outputs the thus-selected signal to a boundary scan register 53b of a boundary scanning circuit 53 provided in the semiconductor chip.

Reference numeral 53 designates a boundary scanning circuit provided in the semiconductor chip. Reference numerals 53a and 53b designate boundary scan registers of the boundary scanning circuit 53. The boundary scanning circuit 53 comprises boundary scan registers (shift registers) provided between pins of individual devices and internal logic circuits so as to correspond to respective pins of the semiconductor chip. In general, the technique employing the boundary scanning circuit 53 has been standardized as IEEE standard specification P1149.1 (1990) and is one type of scanning technique used for testing a board having an LSI mounted thereon (i.e., a printed board).

The operation of the semiconductor device shown in FIG. 8 will now be described. When the T_ENA signal is brought to low, the semiconductor device performs a conventional boundary scanning operation. In contrast, when the T_ENA signal is brought to high, the semiconductor device performs operations which enable checking of switching action of the selectors 23 and 24.

First, the conventional boundary scanning operation will be described. When the T_ENA signal is brought to low ("L" value), the selector 51 outputs the signal received from the pin A to the shift register 53a of the boundary scanning circuit 53, and the selector 52 outputs the signal received from the pin B to the shift register 53b of the boundary scanning circuit 53. Consequently, the signals received from the input pins A and B are input directly to the shift registers.

As mentioned above, the signals received from the input pins A and B are input directly to the shift registers 53a and 53b of the boundary scanning circuit 53 corresponding to the individual input pins. A test on input signals can be performed through use of the values thus entered to the shift registers. The semiconductor device can perform conventional boundary scan tests, wherein the tests can be carried out through use of various boundary scan test modes.

The operations which enable checking of switching action of the selectors 23 and 24 will now be described. When the T_ENA signal is brought to high ("H" value), the selector 51 outputs to the shift register 53a of the boundary scanning circuit 53 the signal received from the selector 23, and the selector 52 outputs to the shift register 53b of the boundary scanning circuit 53 the signal received from the selector 24. For these reasons, the shift registers receive the signals from the individual selectors 23 and 24.

More specifically, the individual shift registers 53a and 53b of the boundary scanning circuit 53 receive the signals output from the selectors 23 and 24. The values regarding the shift registers 53a and 53b are output to the outside of the semiconductor device without the flow of signals through the internal circuit of the semiconductor chip. The thus-output signals (i.e., the signals output from the selectors 23 and 24) enable checking of switching action of the selectors 23 and 24. The checking method will now be described by reference to the following test method.

A method of testing the semiconductor device shown in FIG. 8 will now be described. The test method for the semiconductor device shown in FIG. 8 is identical with the test methods used in the first and embodiment 2s, except for a method of checking the switching action of the changeover circuit by means of the switching action checking circuit, and hence repeated explanation will be omitted here.

Figure 9:
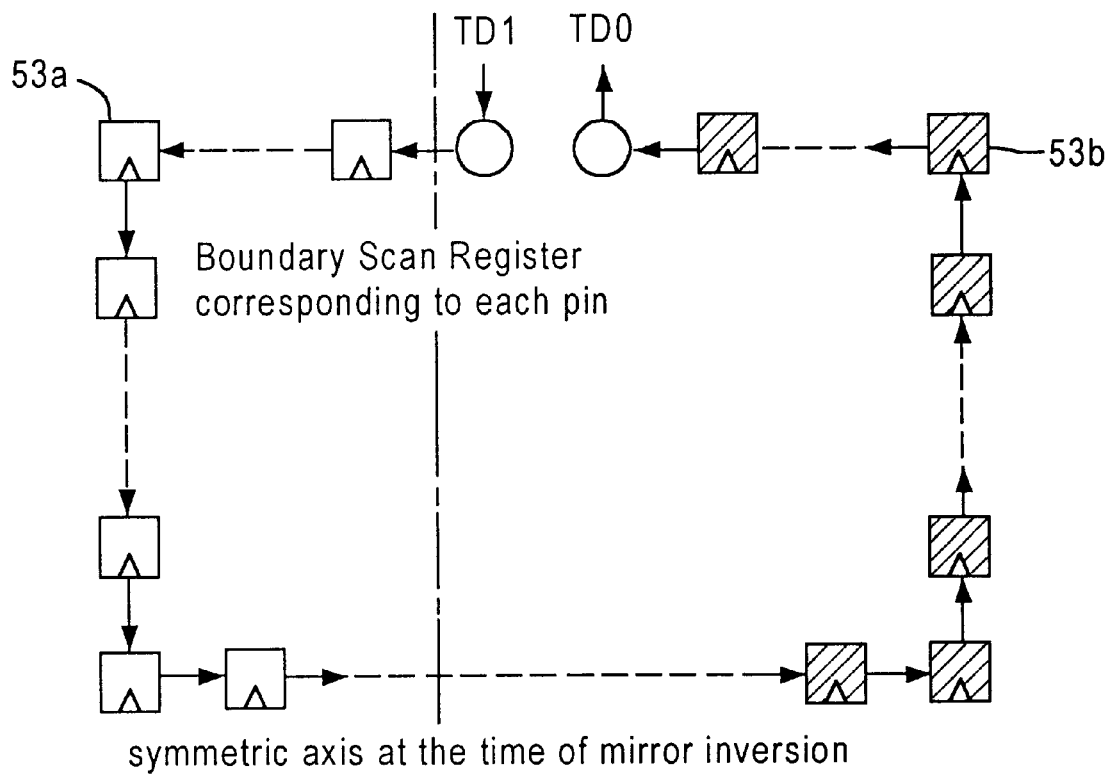
FIG. 9 is a diagrammatic representation for describing a method of checking switching action of the changeover circuit of the semiconductor device shown in FIG. 8.
Figure 10A:
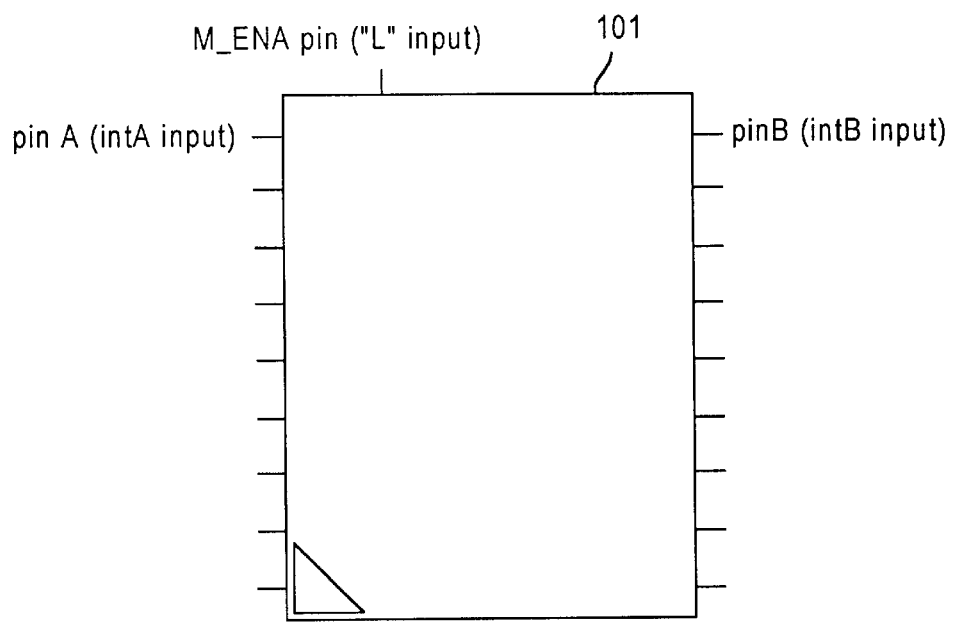
FIGS. 10A and 10B is a conventional semiconductor device capable of being switched into an upwardly-bent or a downwardly-bent semiconductor device by means of the foregoing changeover circuit.
Figure 10B:
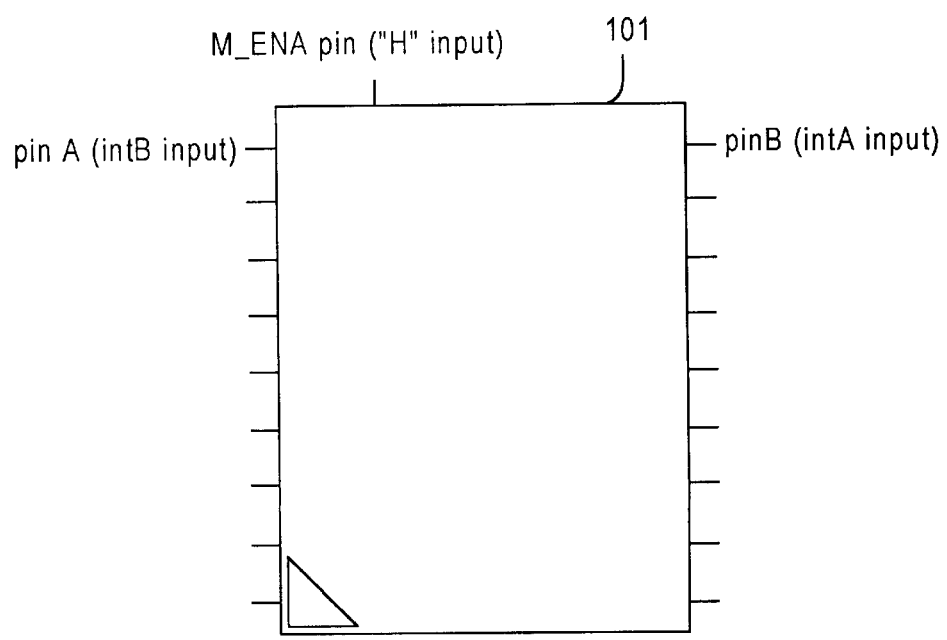
Figure 11A:
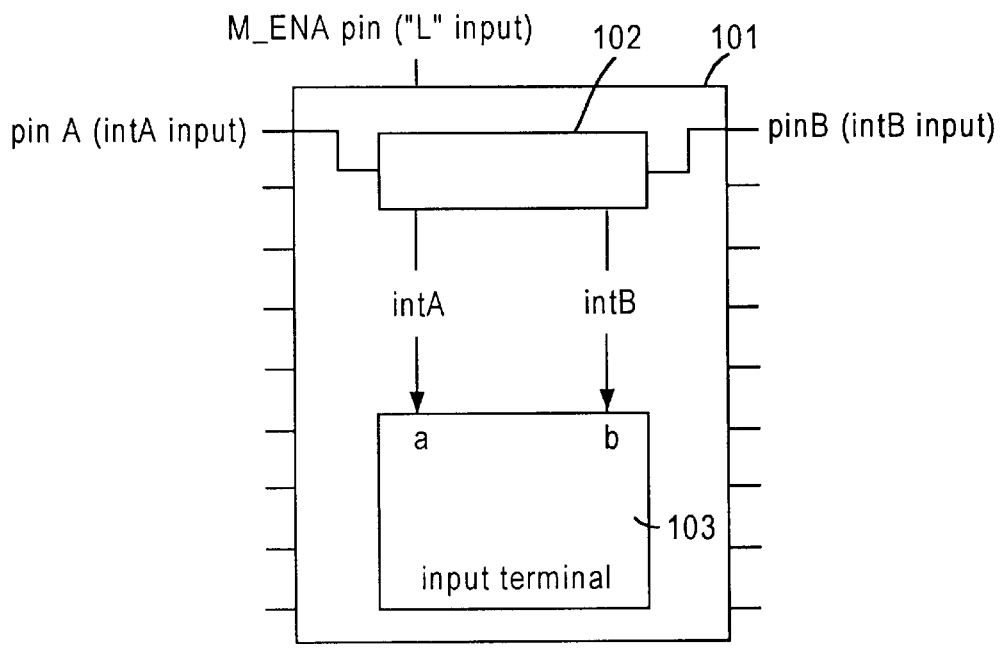
FIGS. 11A and 11B are diagrammatic sketches, showing the interior of the conventional semiconductor device shown in FIGS. 10A and 10B.
Figure 11B:
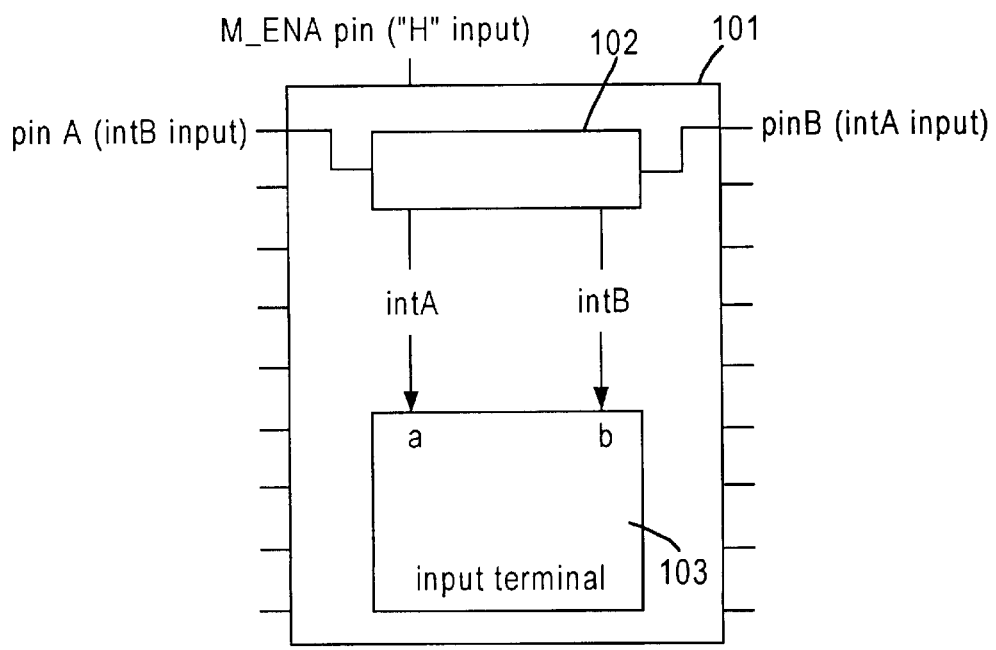
Figure 12A:
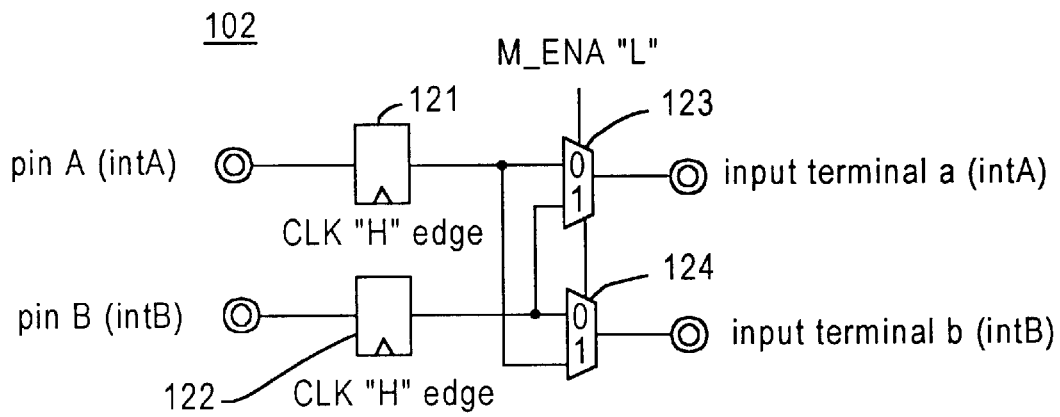
FIGS. 12A and 12B is a changeover circuit 102 shown in FIGS. 11A and 11B.
Figure 12B:
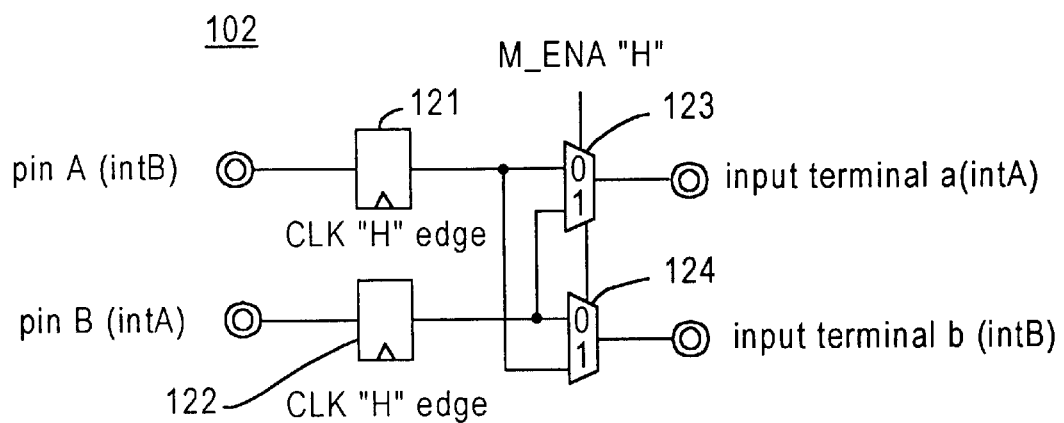
Figure 13:
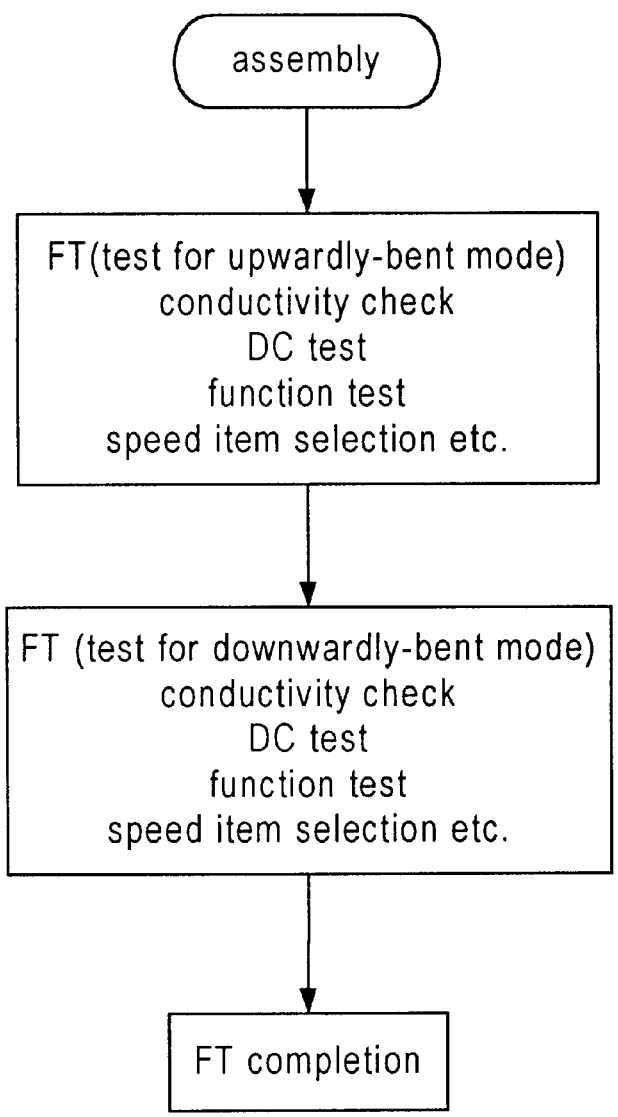
FIG. 13 is a flowchart for testing the semiconductor device shown in FIGS. 10A and 10B.

FIG. 9 is a diagrammatic representation for describing a method of checking switching action of the changeover circuit of the semiconductor device shown in FIG. 8. In the case of a semiconductor chip which is upwardly or downwardly bent by means of the M_ENA signal, individual semiconductor chips are usually mounted on each side of the board. For this reason, as shown in FIG. 9, each of the shift registers of the boundary scanning circuit 53 is divided into two regions (i.e., a right-side region and a left-side region shown in FIG. 9), the shift registers corresponding to two pins connected to one changeover circuit being arranged so as to pertain to different regions.

More specifically, the right-side shift registers are connected in sequence from TDI, and the left-side shift registers are connected in sequence up to TDO. As a result, for example, the shift registers of the boundary scanning circuit 53 corresponding to the pins that face each other can be arranged so as to become mutually symmetrical with respect to the axis of symmetry, by way of the internal circuitry of the semiconductor chip. See a symmetric axis at the time of mirror inversion in FIG. 9.

Therefore, so long as data—which are opposite in phase to each other (i.e., one data set is high, and the other data set is low)—are input to the pins which are switched by means of the M_ENA signal, values regarding the left-side shift registers are output in sequence from the TDO pin, through use of the Shift-DR function of the boundary scanning circuit (i.e., the function of shifting the data regarding the shift registers connected between the pins TDI and TDO toward the TDO pin). Subsequently, value regarding the right-side shift registers can be output in sequence from the TDO pin.

More specifically, if the switching action of each changeover circuit is normal, low-level values are sequentially output the same number of times as are high-level values, the low-level values being output after output of the high-level values. Conversely, if the changeover circuit performs abnormal switching action, values deviating from the low-level values will be output. Consequently, a check can be made as to whether or not the selectors 23 and 24 perform normal switching action by checking of the signals output from the TDO pin. Further, the switching actions of a plurality of changeover circuits can be checked through use of only one TDO pin.

Although in the embodiment 5 the switching action of the changeover circuit which switches connection between the input pins and the terminals provided in the semiconductor chip is checked, the present invention is not particularly limited to this embodiment. It goes without saying that there may be checked the switching action of a changeover circuit which switches connection between terminals provided in a semiconductor chip and output pins.

Since in the embodiment 5 the switching action of the changeover circuit is checked through use of the boundary scanning circuit, the semiconductor chip can be checked by the semiconductor chip being subjected to one full-function test and by checking only the switching action of the changeover circuit.

The foregoing embodiments have described the semiconductor device having a plurality of terminals provided on the its side surfaces, such as that shown in FIG. 1. The present invention is not particularly limited to these embodiments. Needless to say, the present invention may be applied to a semiconductor device whose pins cannot be upwardly bent at the time of assembly, such as a CSP, a BGA, and an FBGA,.

A semiconductor device according to the present invention connects a pair of pins of a semiconductor chip with a pair of terminals provided in the semiconductor chip by way of a changeover circuit and switches connection between the pair of pins of the semiconductor chip and the pair of terminals provided in the semiconductor chip, by controlling the changeover circuit according to a control signal input from the outside of the semiconductor chip. The device comprises a switching action test circuit which tests the switching action of the changeover circuit. Therefore, the switching action of the changeover circuit can be checked, and the semiconductor chip can be tested by being subjected to solely one full-function test and a switching action test.

Further, the changeover circuit is an output changeover circuit connected to a pair of output terminals of the semiconductor chip as well as to output terminals provided in the semiconductor chip, and the switching action test circuit has a bypass circuit which enables direct input, to the output changeover circuit, of signals received from input pins of the semiconductor chip. With such a configuration, the switching action of the output changeover circuit can be tested without being affected by operations of an internal circuit of the semiconductor chip.

Further, the switching action test circuit has a comparator which compares the signals input to the changeover circuit with the signals output from the changeover circuit, and a comparison result is output to the outside of the semiconductor chip from the comparator. With such a configuration, the switching action of the changeover circuit can be checked through comparison of the signals input to the changeover circuit with the signals output from the changeover circuit. Moreover, the result of such comparison can be detected outside of the semiconductor device.

Further, the semiconductor device comprises a plurality of comparators, wherein the switching action of the changeover circuit is tested on the basis of an logical AND or logical OR result of the comparison results output from the plurality of comparators. With such a configuration, there can be made a determination as to whether or not the changeover circuit operates normally, through use of only one bit of an output signal.

A boundary scanning circuit having a boundary scanning register is provided in the semiconductor chip, and the switching action test circuit has an input circuit which enables input, to the boundary scanning register, of a signal output from the changeover circuit provided in the semiconductor chip. The output signal is output to the outside of the semiconductor device by way of the boundary scanning register. With such a configuration, the switching action of the changeover circuit—which switches connection between the pins of the semiconductor chip and the terminals provided in the semiconductor chip—can be tested, and there can be made a determination as to whether or not the changeover circuit operates normally, through use of only one bit of an output signal.

A method of manufacturing a semiconductor device which connects a pair of pins of a semiconductor chip with a pair of terminals provided in the semiconductor chip by way of a changeover circuit and which switches connection between the pair of pins of the semiconductor chip and the pair of terminals provided in the semiconductor chip, by controlling the changeover circuit according to a control signal input from the outside of the semiconductor chip, the method comprising the steps of forming a switching action test circuit for testing the switching action of the changeover circuit; performing a final test under first connect condition in which the pair of pins of the semiconductor chip are connected with the pair of terminals provided in the semiconductor chip by controlling a control signal after the step of forming a switching action test circuit; and checking the switching action of the changeover circuit through use of the switching action test circuit under second connect condition in which the connection made during the step of performing a final test between the pair of pins of the semiconductor chip and the pair of terminals provided in the semiconductor chip is reversed by controlling the control signal after the step of performing a final test.

Therefore, it is possible to check functions of a semiconductor chip in both an upwardly-bent mode and a downwardly-bent mode by subjecting the semiconductor chip to solely a full-function test and by checking solely the operations of a changeover circuit. Consequently, the number of test steps can be reduced.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-231740 filed on Aug. 18, 1998 including specification, claims, and summary are incorporated herein by reference in its entirety.

What is claimed is:

1. A semiconductor device which connects a pair of pins of a semiconductor chip with a pair of terminals provided in the semiconductor chip by way of a changeover circuit and which switches connection between the pair of pins of the semiconductor chip and the pair of terminals provided in the semiconductor chip, by controlling the changeover circuit according to a control signal input from the outside of the semiconductor chip, the device comprising a switching action test circuit which tests the switching action of the changeover circuit.

2. The semiconductor device according to claim 1, wherein said changeover circuit is an output changeover circuit connected to a pair of output terminals of the semiconductor chip as well as to output terminals provided in the semiconductor chip, and said switching action test circuit has a bypass circuit which enables direct input, to the output changeover circuit, of signals received from input pins of the semiconductor chip.

3. The semiconductor device according to claim 1, wherein said switching action test circuit has a comparator which compares the signals input to said changeover circuit with the signals output from said changeover circuit, and a comparison result is output to the outside of the semiconductor chip from the comparator.

4. The semiconductor device according to claim 3, further comprising a plurality of comparators, wherein the switching action of said changeover circuit is tested on the basis of an logical AND or logical OR result of the comparison results output from the plurality of comparators.

5. The semiconductor device according to claim 2, wherein said switching action test circuit has a comparator which compares the signals input to the changeover circuit with the signals output from the changeover circuit, and a comparison result is output to the outside of the semiconductor chip from the comparator.

6. The semiconductor device according to claim 5, further comprising a plurality of comparators, wherein the switching action of said changeover circuit is tested on the basis of an logical AND or logical OR result of the comparison results output from the plurality of comparators.

7. The semiconductor device according to claim 1, further comprising a boundary scanning circuit having a boundary scanning register in the semiconductor chip, wherein said switching action test circuit has an input circuit which enables input, to the boundary scanning register, of a signal output from said changeover circuit provided in the semiconductor chip, and the output signal is output to the outside of the semiconductor device by way of the boundary scanning register.

* * * * *